United States Patent
Ng

(10) Patent No.: US 7,982,499 B2
(45) Date of Patent: Jul. 19, 2011

(54) CAPACITIVE NODE ISOLATION FOR ELECTROSTATIC DISCHARGE CIRCUIT

(75) Inventor: Philip S. Ng, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/459,734

(22) Filed: Jul. 25, 2006

(65) Prior Publication Data
US 2008/0024169 A1    Jan. 31, 2008

(51) Int. Cl.
*H03K 19/0175* (2006.01)

(52) U.S. Cl. .............. 326/81; 326/83; 326/27; 327/112; 361/56

(58) Field of Classification Search ............ 326/81–87; 361/111, 56–58, 91.1, 118
See application file for complete search history.

(56) References Cited

U.S. PATENT DOCUMENTS

| | | | | |
|---|---|---|---|---|
| 5,538,907 A |   | 7/1996 | Aronowitz et al. ............. 437/34 |
| 5,654,648 A | * | 8/1997 | Medhekar et al. ............. 326/17 |
| 5,864,506 A | * | 1/1999 | Arcoleo et al. .......... 365/189.05 |
| 5,917,336 A |   | 6/1999 | Smith et al. ..................... 326/30 |
| 5,926,651 A | * | 7/1999 | Johnston et al. ................ 710/52 |
| 6,118,301 A | * | 9/2000 | Singh et al. ..................... 326/58 |
| 6,307,409 B1 | * | 10/2001 | Wrathall ....................... 327/112 |
| 6,326,821 B1 | * | 12/2001 | Gabara ......................... 327/112 |
| 6,545,520 B2 | * | 4/2003 | Maloney et al. ............. 327/313 |
| 6,765,772 B2 | * | 7/2004 | Lee et al. ........................ 361/56 |
| 6,781,397 B2 | * | 8/2004 | Manning ...................... 324/763 |
| 6,958,896 B2 | * | 10/2005 | Lin et al. ......................... 361/56 |
| 7,245,468 B2 | * | 7/2007 | Griesbach et al. ............. 361/56 |
| 7,339,770 B2 | * | 3/2008 | Maloney et al. ............... 361/56 |
| 7,408,377 B2 | * | 8/2008 | Castagna et al. ............... 326/27 |

* cited by examiner

*Primary Examiner* — James H. Cho
*Assistant Examiner* — Christopher Lo
(74) *Attorney, Agent, or Firm* — Fish & Richardson P.C.

(57) ABSTRACT

Capacitive node isolation circuitry in an integrated circuit eliminates the creation of hot spots (stored charge) on high capacitive nodes during a test of electrostatic discharge (ESD) protection circuitry of the integrated circuit or during any ESD event occurring while the integrated circuit is in a standby mode. The isolation circuitry includes a standby mode logic circuit responsive to a standby mode signal received at one of its inputs and provides an output signal to a gate of an active switching device located in a path between an external pin of the integrated circuit and the internal high capacitive node. The output signal keeps the active switching device turned off for the duration of the ESD test or ESD event. The standby mode logic circuit transparently passes an input logic signal to the active switching device whenever the integrated circuit is in a normal operating mode.

11 Claims, 2 Drawing Sheets

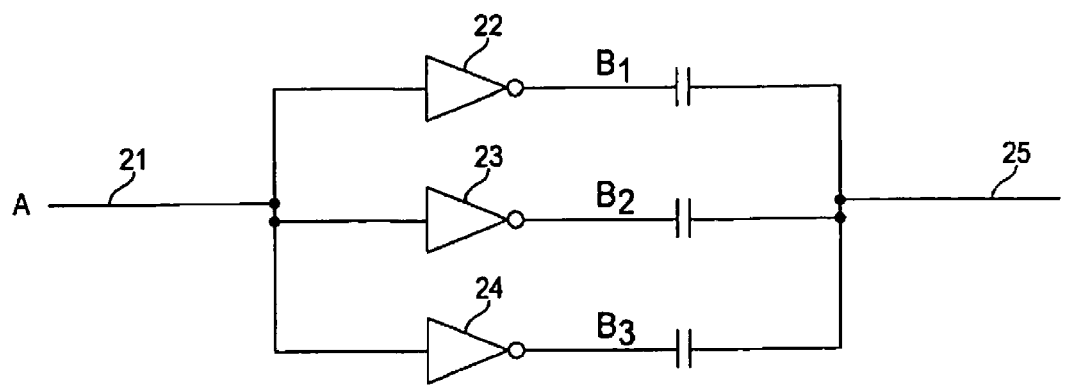
Fig._3
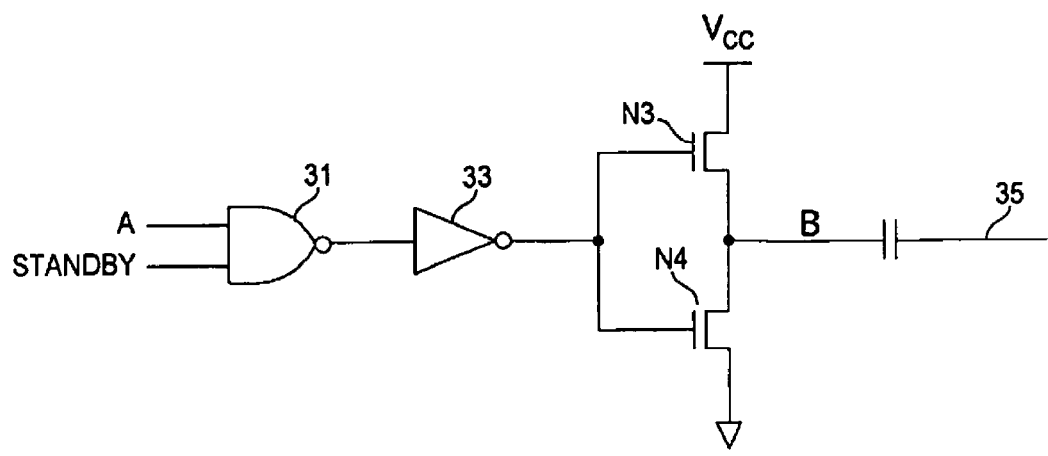
Fig._4

US 7,982,499 B2

CAPACITIVE NODE ISOLATION FOR ELECTROSTATIC DISCHARGE CIRCUIT

TECHNICAL FIELD

The present invention relates to integrated circuit testing and in particular relates to improvement of electrostatic discharge capabilities of integrated circuits.

BACKGROUND ART

Integrated circuits are typically provided with electrostatic discharge (ESD) protection circuitry between the external pins of the device and the main circuit in order to shunt ESD pulses safely to ground and thereby prevent damage to the integrated circuit. Typical ESD pulses can easily exceed 2000 Volts and deliver peak currents of 1 to 30 Amperes within a rapid rise time of 1 to 10 nanoseconds followed by a slow decay in electrical current over the next 100 nanoseconds or so. As a normal part of quality control following integrated circuit manufacture, the ESD protection circuitry is tested. An ESD test normally involves applying a standard electrical waveform representative of one or more ESD events to the various external pins of the manufactured device and observing whether or not the ESD protection circuitry associated with each of those pins adequately handles the test waveform within specified tolerances.

Unfortunately, it has been observed that, notwithstanding the presence of ESD protection circuitry manufactured to design specifications, the very act of ESD testing can, under certain circumstances, create damaging hot spots (stored charge) within an integrated circuit. This is particularly the case when the power supply pin is being tested. The power supply pin is connected to many circuit elements in the main circuit in order to provide the electric power needed for its normal operation. Integrated circuits may also include large capacitive nodes (long conductive lines), which can be coupled through such circuit elements to the power supply pin.

For example, FIG. 1 shows a typical CMOS inverter comprising p-channel and n-channel transistors P1 and N1. The p-channel transistor P1 of this inverter is connected to the power supply (VCC) pin. A conductive line 5 forms a high capacitance node B at the output of this inverter. Accordingly, in this circuit the high capacitive node B is coupled to the VCC pin by the transistor P1. For an ESD test of the VCC pin, the chip is placed in a standby mode. However, this may not guarantee that the transistor P1 will remain of during an ESD test. If node A on the input side of the inverter happens to be at a logic 0 voltage level when the chip enters standby, then the p-channel transistor P1 could turn on when the VCC pin momentarily goes high during an ESD test pulse. That will in turn couple the VCC pin to the high capacitive node B, which may thereby receive charge from the ESD test pulse via that VCC pin. This receiving of charge may occur even though most of the charge is safely shunted to ground by the ESD protection circuitry associated with the VCC pin, and in some cases the amount of charge received by a high capacitive node B can be quite large. After the ESD test, when the power supply voltage has gone back down, the transistor P1 shuts off, isolating the high capacitive node B and its stored charge. N-channel transistor N1 remains off through the entire test operation and thus does not provide a sink to ground for the charge received and stored at node B. The high capacitive node B discharges only very slowly.

Although the amount of stored charge and its associated voltage is not large enough to immediately damage the devices connected to the high capacitive node—that after all is the main reason for having ESD protection circuitry—if a high voltage at node B were to be sustained for a long enough time, it could stress the connected devices such that junction degradation in those devices is possible. Current leakage resulting from junction degradation of any devices can cause circuit malfunction under normal operation.

SUMMARY DISCLOSURE

The present invention eliminates the ESD charge storage problem on high capacitive nodes coupled to an external pin. In particular, the integrated circuit is provided with a logic circuit element, such as a logic gate, responsive to a standby mode signal for generating a control signal that is applied to the gate of a transistor or other active switching element between the external pin and a high capacitive node in order to ensure that in a standby mode, the transistor or active switching element remains off during an ESD test, or during the occurrence of an ESD event, so that the external pin is effectively isolated from the high capacitive node during such ESD test or event. Such a logic circuit element is included at every location in the integrated circuit where a high capacitive node could potentially coupled to an external pin. The added logic circuit element is chosen to be transparent whenever the integrated circuit is not in a standby mode.

Alternatively or in addition, and wherever possible, the high capacitive node could be broken into many smaller capacitive nodes with duplicate drivers or other active circuit devices connected to the several smaller capacitive nodes in order to eliminate or reduce to a minimum the number of high capacitive nodes needing standby isolation for the ESD test.

BRIEF DESCRIPTION OF THE DRAWINGS

FIG. 3 is a schematic circuit diagram of an alternative or additional embodiment of the present invention, illustrating the break-up of a high capacitive node into plural smaller capacitive nodes, each with its own associated inverter driver.

FIG. 4 is a schematic circuit diagram of another exemplary embodiment of the present invention.

DETAILED DESCRIPTION

Figure 1:
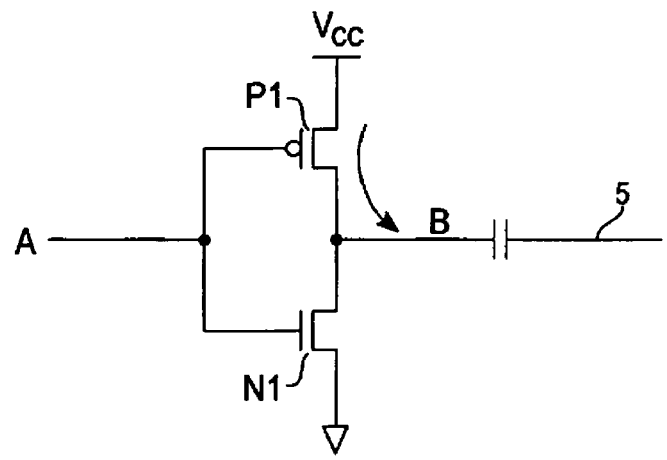
FIG. 1 is a schematic circuit diagram of a prior art inverter circuit coupled to both a power supply pin and a high capacitive node.
Figure 2:
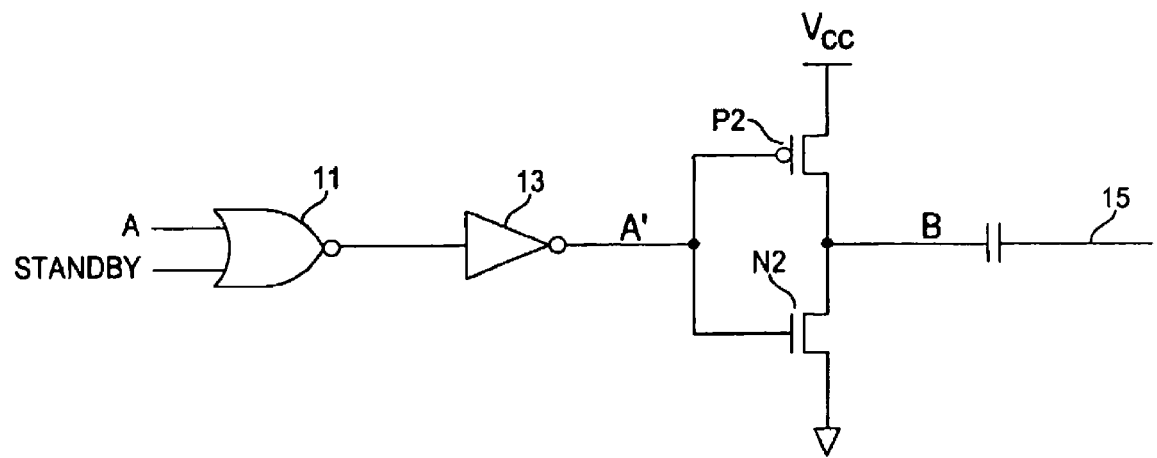
FIG. 2 is a schematic circuit diagram of an exemplary embodiment of the present invention providing a standby mode logic circuit (here, a NOR gate) coupled to the input end of an inverter circuit associated with a high capacitive node.

With reference to FIG. 2, a high capacitive node B can be coupled, for example, to a power supply pin VCC via an active switching element of an integrated circuit, e.g., in this embodiment, a p-channel transistor P2 of a CMOS inverter. Likewise, in this exemplary embodiment, the node B can also be coupled to ground pin of the integrated circuit via another active switching element of the circuit, namely an n-channel transistor N2 of the CMOS inverter. When the inverter's input A' is at a logic 0 level, the p-channel transistor P2 will be on, coupling the VCC pin to the node B, while the n-channel transistor N2 will be off, isolating the node B from ground. Node B will be pulled up to the VCC voltage level. In contrast, when the inverter's input A' is at a logic 1 level, the p-channel transistor P2 will be off, so that node B is isolated from the VCC pin, while n-channel transistor N2 will be on, coupling the node B to ground. The inverter shown here is merely exemplary of a circuit element coupling a high capacitive node B to an external device pin via an active switching device, such as the transistor P2. The external pin need not be a power supply pin VCC. A variety of other circuit elements, such as NAND and NOR logic gates, latches and flip-flops, amplifiers, etc., also have switching elements that can couple a high capacitive node to the pin. In addition to the switching device, such as transistor P2, there may be additional resistive or capacitive elements present in the path between the external pin and the internal pin and the internal high capacitive node B that still permit coupling between the pin and node. The present invention encompasses all of these cases and provides the additional logic circuitry that ensures that high capacitive nodes, like node B, remain isolated from the external pin during a standby mode. The integrated circuit would be placed in the standby mode for an ESD test on a pin. The invention's isolation of the high capacitive node from the external pins of the device present any charge from an ESD event reaching the internal node.

In FIG. 2, the additional logic circuitry is in the form of a NOR gate-inverter combination 11 and 13 that generates a control signal at the node A' which is guaranteed to keep transistor P2 off in a standby mode, while transparently passing a logic signal A to the affected circuit elements P2 and N2 in a normal operating mode. As already noted, the transistor P2, between the VCC pin and high capacitive node B, is off when the input node A' gating the transistor P2 is at a logic 1 level. Accordingly, the NOR gate-inverter combination 11 and 13 is used to provide a logic 1 level in the standby mode. The NOR gate 11 receives a logic signal A and also a STANDBY mode signal at its respective inputs. During a standby mode (STANDBY=1), the output A'=1 from the NOR gate-inverter combination 11 and 13. During a normal operating mode (STANDBY=0), the signal A'=A, and thus the additional logic circuitry 11 and 13 is completely transparent for the logic signal A.

Depending on the particular circuitry coupling a high capacitive node to the VCC pin, and in particular the type of active switching device (p-channel versus n-channel transistor) located between the VCC pin and that high capacitive node, the inverting element 13 may not be needed. In particular, as seen in FIG. 4 if an n-channel transistor N3 were to couple a high capacitive node to the VCC pin, then a logic 0 input to that transistor's gate would be needed during standby to guarantee the isolation of the node from the VCC pin.

The polarity of the STANDBY mode signal can be reversed (STANDBY=0 during standby mode, =1 during normal operation), in which case the NOR gate 11 can be replaced with a NAND 31 gate, as seen in FIG. 4.

Note also, that in addition to isolating the node B from the VCC pin, the additional circuitry's signal output also guarantees that the transistor N2 to ground is on, providing a current sink for the node B.

The additional circuitry is provided in the integrated circuit only where high capacitive nodes are present that could form hot spots during en ESD test. Exactly what constitutes a "high" node capacitance is a design parameter that depends, for example, upon the capabilities of the ESD protection circuitry provided with the integrated circuit, the conductance properties of the active switching device coupling the node to the VCC pin, the desired stress limits upon devices coupled to that node. A circuit designer can provide the additional logic circuitry whenever it is determined that a particular node meets a specified "high" capacitance condition.

With reference to FIG. 3, in an alternative or additional embodiment, some or all of the nodes in an integrated circuit that are determined to be high capacitance nodes can be divided into several smaller capacitance nodes, e.g., nodes B1, B2 and B3. Each of these smaller capacitance nodes would require their own drivers, such as the inverters 22, 23 and 24 for nodes B1, B2 and B3. Between the input 21 receiving a logic signal A and the output 25, the multiple drivers and nodes are functionally equivalent to a single driver and high capacitance node, but the specified high capacitance condition is not met by any of the smaller capacitance nodes B1, B2 or B3. Thus, the additional logic in FIG. 2, such as the NOR gate-inverter combination 11 and 13 would not be needed in that case. Alternatively, if a particular node has a very high capacitance, that node could be divided into smaller high capacitance nodes that would still require the additional logic 11 and 13, but the subdividing into smaller capacitances would provide additional assurances that the associated devices coupled to the respective nodes B1, B2 and B3 would not be unduly stressed in the event some charge were somehow to couple into one or more of those nodes.

An integrated circuit according to the present invention may have nodes that are provided with either or both of the solutions described using the examples in FIGS. 2 and 3, including some nodes having the additional circuitry 11 and 13 of FIG. 2, other nodes subdivided as in FIG. 3, and possibly still other nodes being both subdivided and provided with the additional logic.

What is claimed is:

1. A device comprising:

a first transistor having a first gate, a first terminal coupled to a node, and a second terminal coupled to a pin;

a second transistor having a second gate, a third terminal coupled to the node, a fourth terminal coupled to a ground pin, the first and second gates being coupled to each other at a same transistor gate node, wherein the first and second transistors are coupled in series between the pin and the ground pin; and a logic circuit including a first input to receive a first signal, a second input to receive a second signal, and an output directly coupled to the transistor gate node to provide an output signal having signal levels corresponding to signal levels of the first signal when the second signal has a first signal level indicating a normal operating mode of the device, such that in the normal operating mode the output signal has a logic zero level when the first signal has a logic zero signal and the output signal has a logic one level when the first signal has a logic one level, and the output to provide the output signal having a signal level that turns off the first transistor during an electrostatic discharge (ESD) test in a standby mode of the device, wherein the second signal has a second signal level indicating the standby mode is to perform the ESD test to the device.

2. A device comprising:

a first transistor having a first gate, a first terminal coupled to a node, and a second terminal coupled to a pin;

a second transistor having a second gate, a third terminal coupled to the node, a fourth terminal coupled to a ground pin, the first and second gates being coupled to each other at a same transistor gate node, wherein the first and second transistors are coupled in series between the pin and the ground pin; and a logic circuit including a first input to receive a first signal, a second input to receive a second signal, and an output directly coupled to the transistor gate node to provide an output signal having signal levels corresponding to signal levels of the first signal when the second signal has a first signal level indicating a normal operating mode of the device, such that in the normal operating mode the output signal has a logic zero level when the first signal has a logic zero signal and the output signal has a logic one level when the first signal has a logic one level, and the output to provide the output signal having a signal level that turns off the first transistor during an electrostatic discharge (ESD) test in a standby mode of the device, wherein the second signal has a second signal level indicating the standby mode is to perform the ESD test to the device, wherein the logic circuit includes:
- a NOR gate including a first NOR gate input to receive the first signal, a second NOR gate input to receive the second signal, and a NOR gate output; and
- an inverter including an inverter input coupled to the NOR gate output and an inverter output coupled to the transistor gate node.

3. The device of claim 1, wherein the first transistor includes a p-channel transistor and the second transistor includes an n-channel transistor.

4. The device of claim 3, wherein the first signal level of the second signal has a value less than a value of the second signal level of the second signal.

5. The device of claim 4, wherein the pin is configured to couple to a power supply.

6. The device of claim 5, wherein the node coupled to the first terminal of the first transistor is coupled to at least one capacitive element.

7. A device comprising:
- a first transistor having a first terminal coupled to a node, a second terminal coupled to a pin, wherein the first and second transistors include n-channel transistors;
- a second transistor having a third terminal directly coupled to the node, a fourth terminal coupled to a ground pin, wherein the first and second transistors are coupled in series between the pin and the ground pin, wherein the first and second transistors include gates directly coupled to each other at a same transistor gate node; and
- a logic circuit to receive a first signal and a second signal to turn off both the first and second transistors when the second signal has a first signal level indicating a first mode of the device, and to turn on both the first and second transistors based on a signal level of the first signal when the second signal has a second signal level indicating a second mode of the device, wherein the logic circuit includes:
  - a NAND gate having a first NAND gate input to receive the first signal, a second NAND gate input to receive the second signal, and a NAND gate output; and
  - an inverter including an inverter input coupled to the NAND gate output and an inverter output coupled to gates of the first and second transistors.

8. The device of claim 7, wherein the first mode includes a standby mode of the device, and the second mode includes a normal operating mode of the device.

9. A method comprising:
- passing a first signal from a first input of a logic circuit of a device to an output of the logic circuit to control at least one of a first switching element and a second switching element coupled to the output of the logic circuit when the device is in a first mode, the first switching element including a first terminal coupled to a node and a second terminal coupled to a pin, and the first and second switching elements coupled in series between the pin and a ground pin;
- applying a second signal to a second input of the logic circuit to provide an output signal at the output of the logic circuit to turn off the switching element to isolate the node from the pin when the device is in a second mode, the first and second signals being independent from each other, such that a signal level of the second signal is independent of a signal level of the first signal, wherein the first mode includes a normal operating mode of the device and the second mode includes a standby mode of the device; and
- performing an electrostatic discharge (ESD) test to the device during the standby mode.

10. The method of claim 9, wherein the first switching element includes a p-channel transistor having terminals coupled between the node and the pin, and the output signal is provided to a gate of the p-channel transistor.

11. The method of claim 9, wherein the first switching element includes an n-channel transistor having terminals coupled between the node and the pin, and the output signal is provided to a gate of the n-channel transistor.

* * * * *

UNITED STATES PATENT AND TRADEMARK OFFICE
CERTIFICATE OF CORRECTION

| | | |
|---|---|---|
| PATENT NO. | : 7,982,499 B2 | Page 1 of 1 |
| APPLICATION NO. | : 11/459734 | |
| DATED | : July 19, 2011 | |
| INVENTOR(S) | : Philip S. Ng | |

It is certified that error appears in the above-identified patent and that said Letters Patent is hereby corrected as shown below:

Column 1, Line 48; replace:
"guarantee that the transistor P1 will remain of during an ESD" with
-- guarantee that the transistor P1 will remain off during an ESD --

Column 3, Line 56; replace:
"hot spots during en ESD test. Exactly what constitutes a" with
-- hot spots during an ESD test. Exactly what constitutes a --

Signed and Sealed this
Twenty-eighth Day of February, 2012

David J. Kappos
*Director of the United States Patent and Trademark Office*